(12) United States Patent
Chriqui et al.

(10) Patent No.: US 11,587,967 B1
(45) Date of Patent: Feb. 21, 2023

(54) MEGAPIXEL-RESOLUTION PHOTONIC INTEGRATED CIRCUIT BASED IMAGER

(71) Applicant: Lockheed Martin Corporation, Bethesda, MD (US)

(72) Inventors: Guy Chriqui, San Mateo, CA (US); Alan L. Duncan, Broken Arrow, OK (US); Gregory S. Feller, Kentfield, CA (US); Chad E. Ogden, San Marcos, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 851 days.

(21) Appl. No.: 16/376,208

(22) Filed: Apr. 5, 2019

(51) Int. Cl.
*G02B 6/12* (2006.01)
*H01L 27/146* (2006.01)
*G02B 6/122* (2006.01)
*G06T 3/40* (2006.01)
*G02B 6/32* (2006.01)

(52) U.S. Cl.
CPC ........ *H01L 27/14627* (2013.01); *G02B 6/122* (2013.01); *G02B 6/12002* (2013.01); *G02B 6/12009* (2013.01); *G02B 6/325* (2013.01); *G06T 3/4053* (2013.01); *G02B 2006/12102* (2013.01); *G02B 2006/12138* (2013.01)

(58) Field of Classification Search
CPC ............ G02B 9/02027; G02B 9/02038; G02B 9/02041; G02B 9/02051; G02B 6/12002; G02B 6/4298
See application file for complete search history.

(56) References Cited

U.S. PATENT DOCUMENTS

| | | | |
|---|---|---|---|
| 10,302,409 B1 * | 5/2019 | Duncan | G01B 9/02038 |
| 10,753,796 B1 * | 8/2020 | Duncan | G01J 3/1895 |
| 11,035,985 B1 * | 6/2021 | Chriqui | G02B 27/0087 |

* cited by examiner

*Primary Examiner* — Charlie Y Peng
(74) *Attorney, Agent, or Firm* — BakerHostetler

(57) ABSTRACT

A photonic integrated circuit (PIC)-based imager blade includes a number of PIC imager units stacked on top of one another. Each PIC imager unit includes a PIC coupled, at a first end and a second end, to a first set of lenslets and a second set of lenslets, respectively. An electronic integrated circuit (EIC) is coupled to the PIC. Pairs of lenslets of the first and second set of lenslets are optically coupled to respective waveguides embedded in the PIC. The PIC imager units have different lengths, and longer PIC imager units include larger lenslets.

16 Claims, 8 Drawing Sheets

MEGAPIXEL-RESOLUTION PHOTONIC INTEGRATED CIRCUIT BASED IMAGER

STATEMENT REGARDING FEDERALLY SPONSORED RESEARCH OR DEVELOPMENT

Not applicable.

FIELD OF THE INVENTION

The present invention generally relates to photonic integrated circuits (PICs), and more particularly to a megapixel-resolution PIC-based imager.

BACKGROUND

Segmented planar imaging detector for electro-optical reconnaissance (SPIDER) is an imaging system formed with waveguide arrays and other components needed to combine light from separate optical collectors, such as telescopes or lenslets. SPIDER can achieve the performance capability needed by a number of space missions in a radically compressed and low-mass and/or -power package. Alternative SPIDER configurations with more efficiency and less size, weight and cost are required.

SUMMARY

According to various aspects of the subject technology, methods and configuration are disclosed for generating megapixel-resolution images with a photonic integrated circuit (PIC) based imager. The subject disclosure provides a realistic solution for a megapixel-class imager at a fraction of the size, weight, and power of the existing solutions.

In one or more aspects, a PIC-based imager blade includes a number of PIC imager units stacked on top of one another. Each PIC imager unit includes a PIC coupled, at a first end and a second end, to a first set of lenslets and a second set of lenslets, respectively. An electronic integrated circuit (EIC) is coupled to the PIC. Pairs of lenslets of the first and second set of lenslets are optically coupled to respective waveguides embedded in the PIC. The PIC imager units have different lengths, and longer PIC imager units include larger lenslets.

In other aspects, an interferometric imager includes a set of PIC-based imager blades to sample spatial frequencies of a target. Each PIC-based imager blade includes a vertical stack of a number of PIC imager units with different lengths. Each PIC imager unit includes a PIC containing multiple waveguides embedded in the PIC and coupled on each end to a set of lenslets, and an EIC is coupled to the PIC. Pairs of lenslets are optically coupled to respective waveguides, and the set of PIC-based imager blades are disposed in different angular positions on a substrate.

In yet other aspects, a method of providing a megapixel PIC imager includes fabricating a PIC-based imager unit of a set of PIC-based imager units by coupling a PIC to two sets of lenslets. Each set of lenslets is optically coupled to an end of the PIC. A number of waveguide channels embedded in the PIC are coupled to pairs of lenslets of the two sets of lenslets, and the PICS are vertically stacked to form the PIC-based imager unit. The megapixel PIC imager is then formed by disposing the set of PIC-based imager units on a substrate in a star configuration for sampling spatial frequencies of a target.

The foregoing has outlined rather broadly the features of the present disclosure so that the following detailed description can be better understood. Additional features and advantages of the disclosure, which form the subject of the claims, will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block-diagram form in order to avoid obscuring the concepts of the subject technology.

In some aspects of the subject technology, methods and configurations are described for providing a photonic integrated circuit (PIC)-based imager that is capable of generating high-resolution (e.g., megapixel-resolution) images. The solution disclosed herein is a megapixel-class imager at a fraction of the size, weight, and power of the existing solutions.

The subject technology utilizes two lenslet arrays coupled into opposite ends of a PIC. The lenslets are incorporated into prisms, with the lenslets facing normal to the plane of the PIC. The prisms function as 90-degree folds to couple light from the lenslets into waveguides at the edges of the PIC. Utilizing the long-baseline PIC-based imagers, vertical sandwiches of PICs and electronic integrated circuits (EICs)

can be made by stacking up a number of such PIC-based imagers in order to cover the required baselines and have enough image sampling to hit the megapixel resolution. This results in arrays of waveguides under each lenslet corresponding to different points in the field. Redundant baselines with waveguides at different field points can fully sample the field. The disclosed solution allows wide field-of-view (FOV) and high-resolution imaging simultaneously. This is an extraordinary achievement in the payload space and serves as a realistic near-term vision of the segmented planar imaging detector for electro-optical reconnaissance (SPIDER) concept.

Figure 1A:
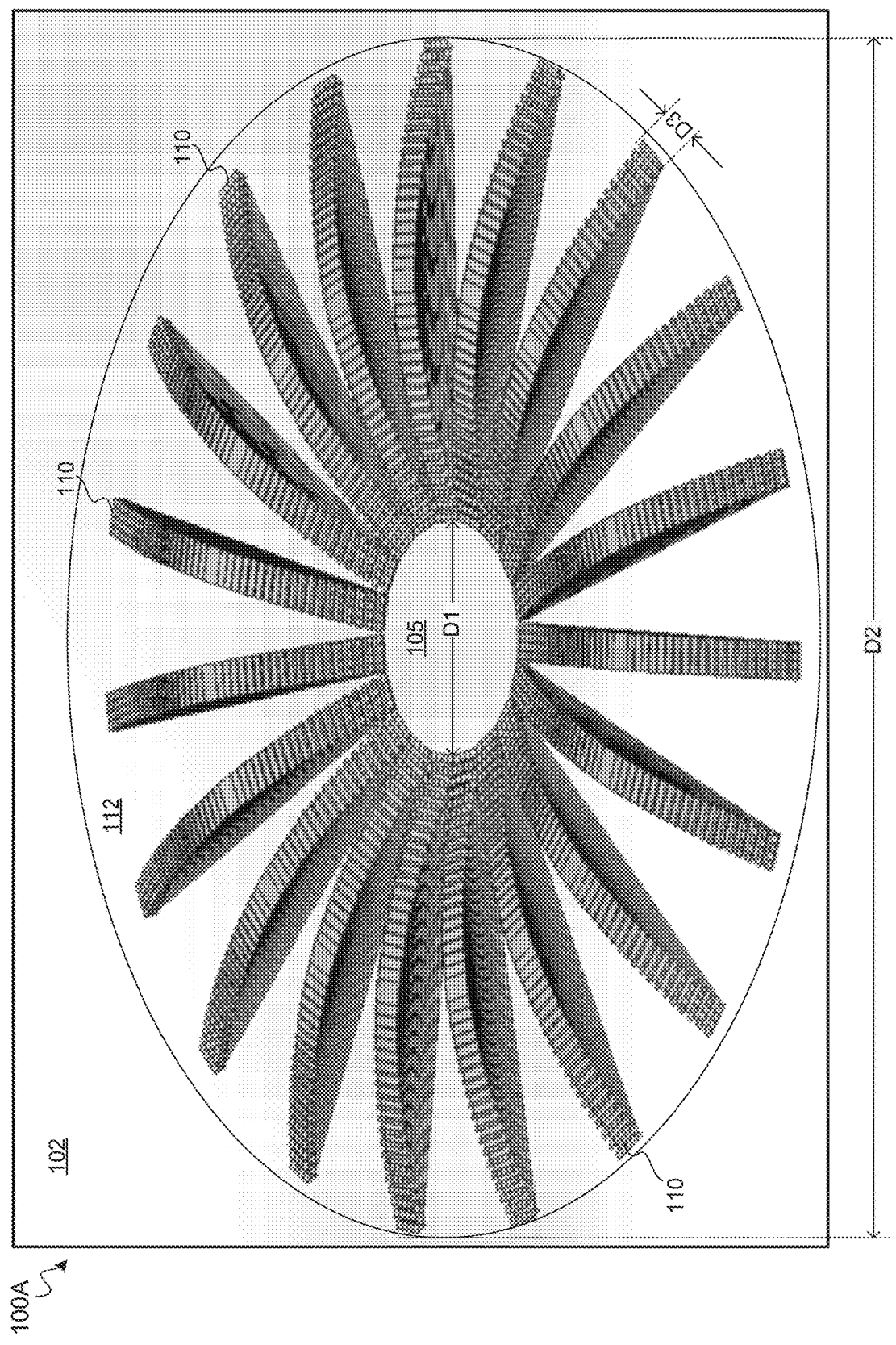
FIGS. 1A, 1B and 1C are conceptual diagrams illustrating views of an example of a megapixel-resolution photonic integrated circuit (PIC)-based imager and a corresponding blade, according to certain aspects of the disclosure.
Figure 1B:
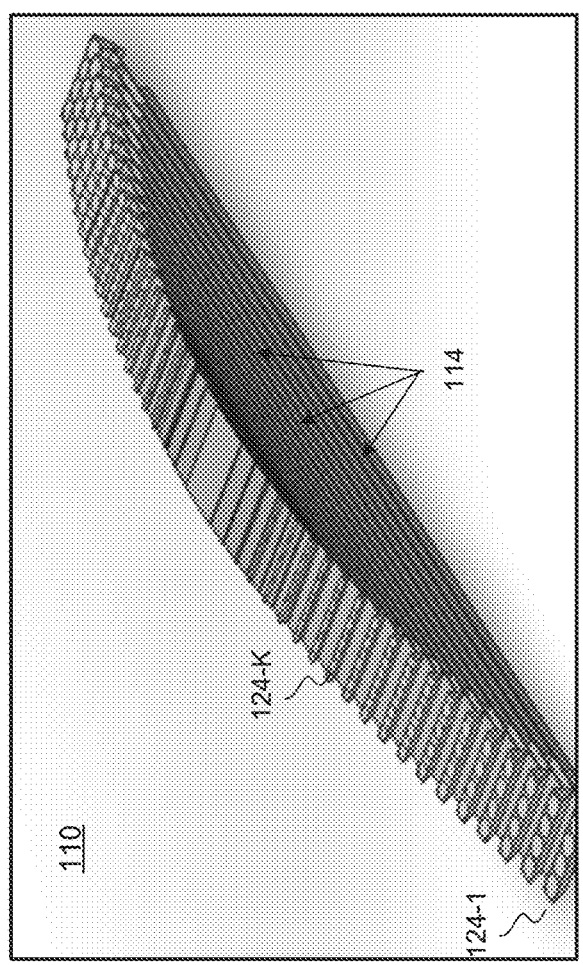
Figure 1C:
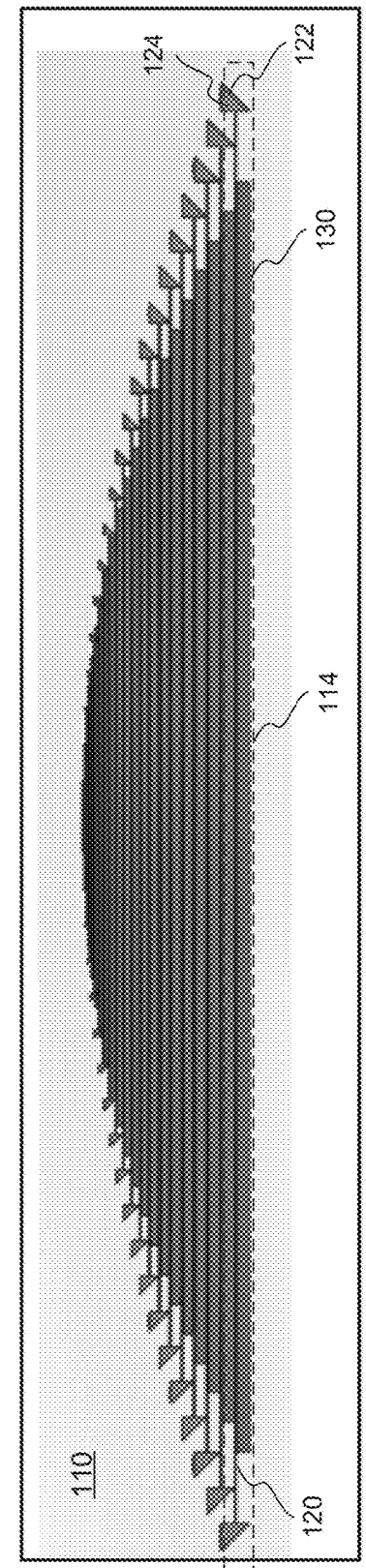

FIGS. 1A, 1B and 1C are conceptual diagrams illustrating views of an example of a megapixel-resolution PIC-based imager 102 (hereinafter, PIC-based imager 102) and corresponding blades 110, according to certain aspects of the disclosure. The PIC-based imager 102, shown in the top view 100A, includes a number of blades 110 that are disposed on a substrate 112. In some implementations, the blades are disposed in a regular configuration such as a star configuration formed around a central hole 105. In one or more implementations, the central hole 105 can have a diameter D1 of about 25 cm, and the PIC-based imager 102 has a diameter D2 of about 125 cm. In the star configuration shown in FIG. 1A, the number of blades 110 may depend on the diameter D1 of the central hole 105 and a width D3 of each blade 110 and can be within a range of about 20-30 blades. In some implementations, the blades 110 are similar and the width D3 is within a range of about 5 cm to 6 cm. The structure of the blades 110 are discussed herein with respect to FIGS. 1B and 1C.

FIG. 1B shows a perspective view 100B of the blade 110, which is a vertical stack of a number (e.g., 20) of PIC imager units 114. The PIC imager units 114 have different lengths, and each includes two sets of lenslets 124 (e.g., 124-1 and 124-K) on its two ends. The stacking of the PIC imager units 114 with different lengths allows populating a number of different baselines to sample spatial frequencies of a target with a thin aperture (e.g., within 5-6 cm thick). The diameter of the lenslets depends on the length of the PIC imager unit 114. The longer PIC imager units have larger-diameter lenslets and a fewer number of lenslets.

FIG. 1C shows a side view 100C of the blade 110 including a vertical stack of PIC imager units 114. Each PIC imager unit 114 includes a PIC 120, an EIC 130, prisms 122 and sets of lenslets 124. The PIC 120 includes a number of optical components such as waveguides, array waveguide gratings (AWGs) and other optical circuits. The EIC 130 may include logic and circuitry such as multiplexers and other processing circuitry. The EIC 130 is attached to the PIC 120 and is electrically and/or optically coupled to the PIC 120. Each PIC 120 includes a number of waveguides that are coupled to pairs of lenslets of the set of lenslets 124. The lenslets of the set of lenslets 124 have their optical axis normal to the plane of the PIC 120 and can be incorporated into prisms 122. The prisms 122 are attached (e.g., optically coupled) to both ends of the PIC 120 and can fold (90-degree) the optical beams from the set of lenslets 124 and direct the optical beams to respective waveguides of the PIC 120.

Figure 2A:
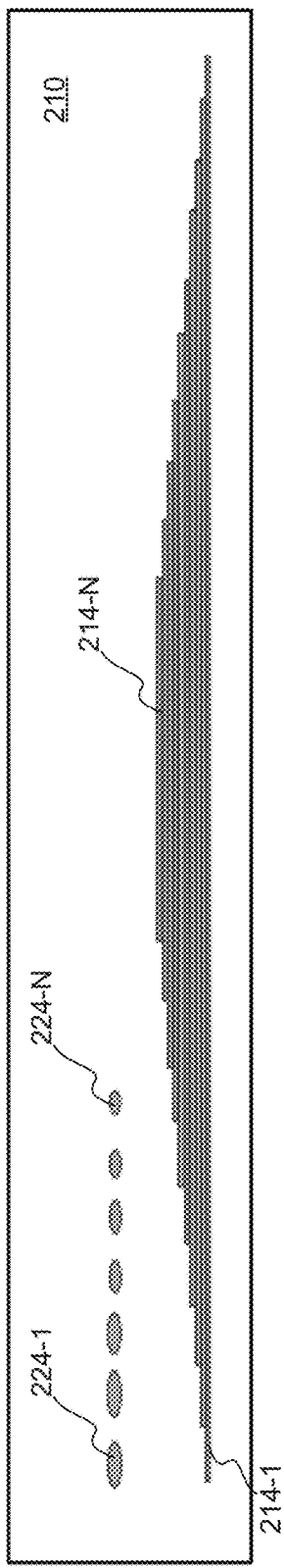
FIGS. 2A, 2B and 2C are conceptual diagrams illustrating various views of an example blade of a PIC-based imager and a PIC imager unit, according to certain aspects of the disclosure.
Figure 2B:
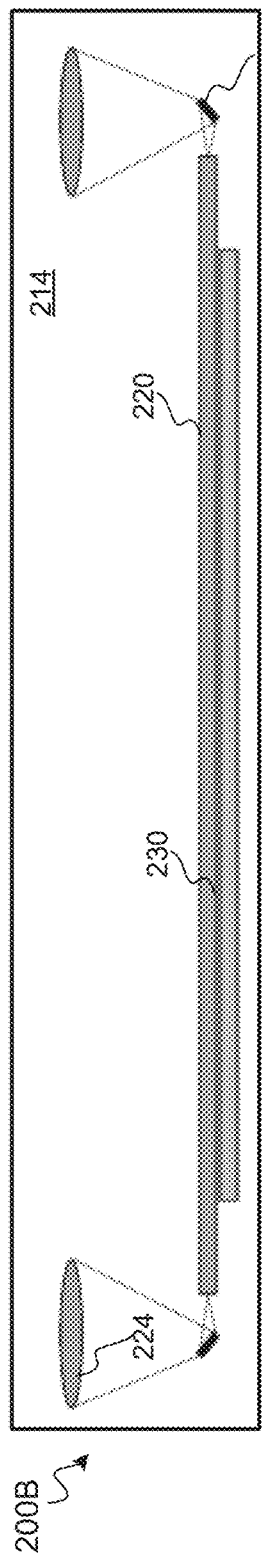
Figure 2C:
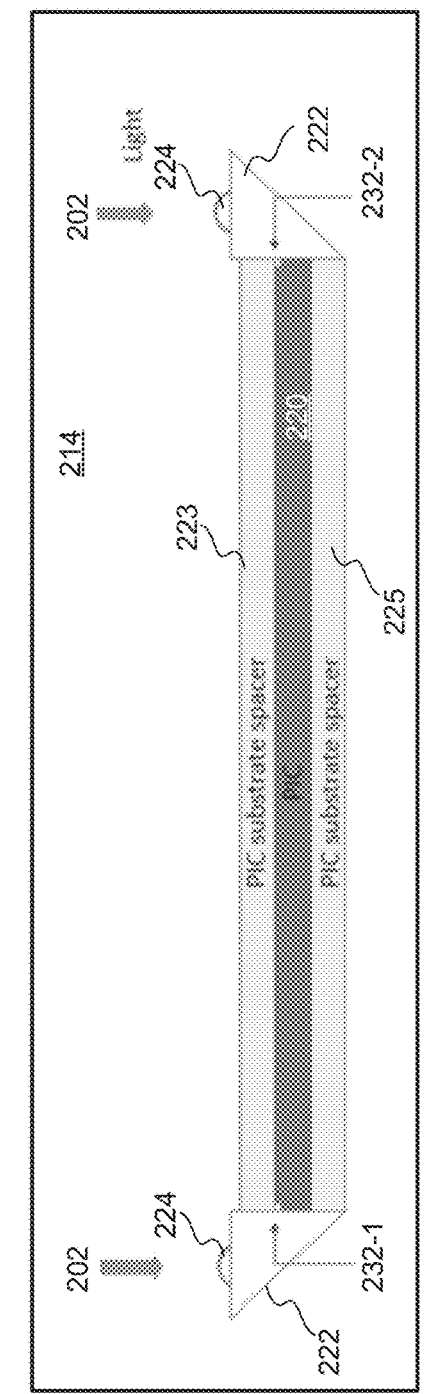

FIGS. 2A, 2B and 2C are conceptual diagrams illustrating various views of an example blade 210 of a PIC-based imager and a PIC imager unit 214, according to certain aspects of the disclosure. The view 200A shows the example blade 210, which is similar to the blade 110 of FIGS. 1A and 1B. The blade 210 is shown in FIG. 2A to emphasize that lenslets 224 (224-1 through 224-N) of sets of lenslets 124 of FIG. 1B have different sizes (diameters) and the longer the PIC imager unit, the larger the diameters of the respective lenslets are. For example, the lenslets 224-1 of the longest PIC imager unit 214-1 are larger than the lenslets 224-N of the shortest longest PIC imager unit 214-N.

The view 200B is a side view of the example PIC imager unit 214 including a PIC 220, an EIC 230, prisms 222 and lenslets 224. The view 200B shows a functional diagram and may not represent an actual implementation of the PIC imager unit 214. The idea presented here is that the light beams from a target are focused by the lenslets 224 and folded 90 degrees by the prisms 222 and directed to waveguides embedded in PIC 220 (not shown for simplicity).

The view 200C is a side view of an example implementation of the PIC imager unit 214. The PIC imager unit 214, as shown in the side view 200C, includes the PIC 220, PIC substrate spacers 223 and 225, prisms 222 and lenslets 224. The lenslets 224 can focus the light beams 202 from the target to the prisms 222, which fold (90-degree) the focused light beams and direct them to the waveguides 232 (232-1 and 232-2) of the PIC 220. The substrate spacers 223 and 225 provide additional thickness for the PIC 220 to enable secure attachment of the PIC 220 to the prisms 222.

Figure 3A:
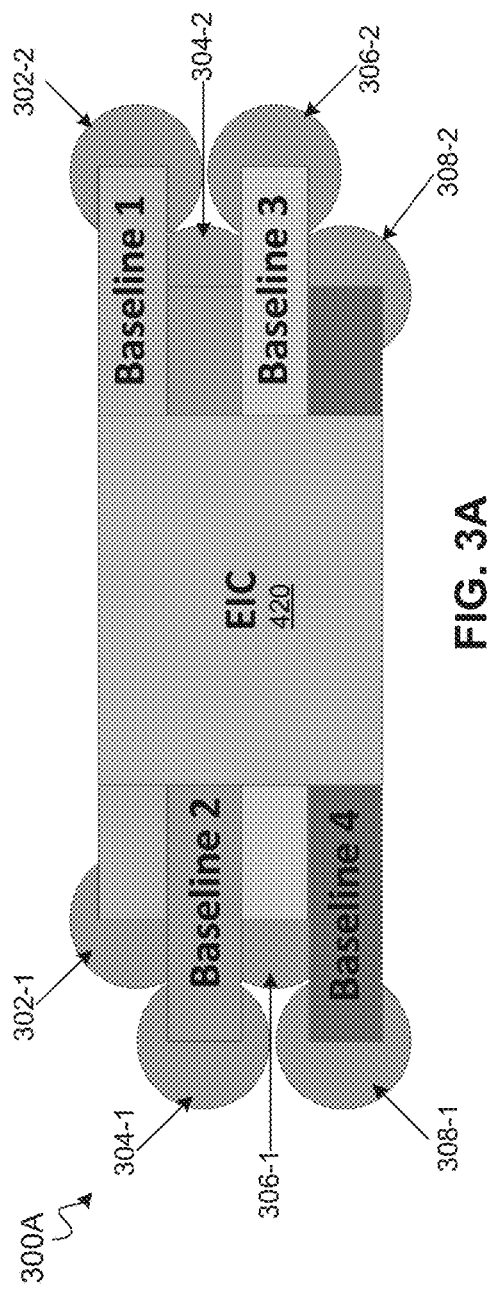
FIGS. 3A and 3B are schematic diagrams illustrating basic layouts of lenslets and waveguides of an example blade of a PIC-based imager, according to certain aspects of the disclosure.
Figure 3B:
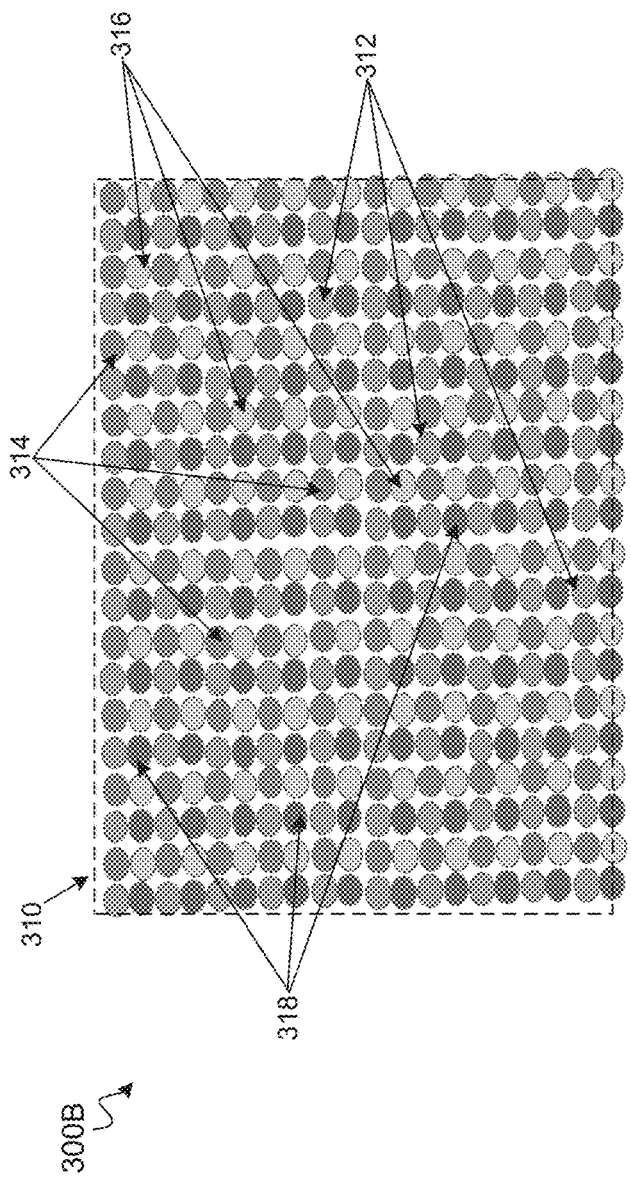
Figure 4B:
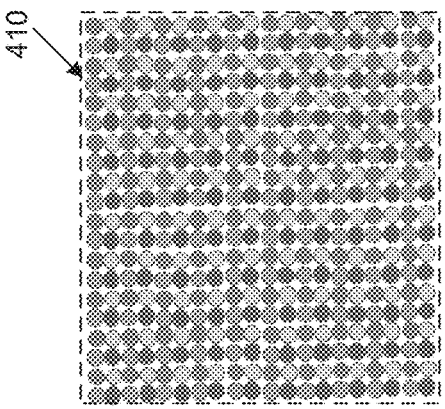
FIGS. 4A, 4B, 4C and 4D are conceptual diagrams illustrating basic layouts of lenslets and waveguides of an example blade of a PIC-based imager, according to certain aspects of the disclosure.
Figure 4D:
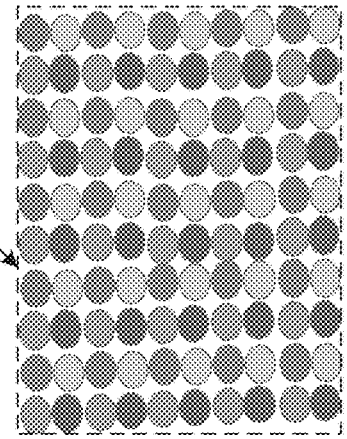
Figure 4A:
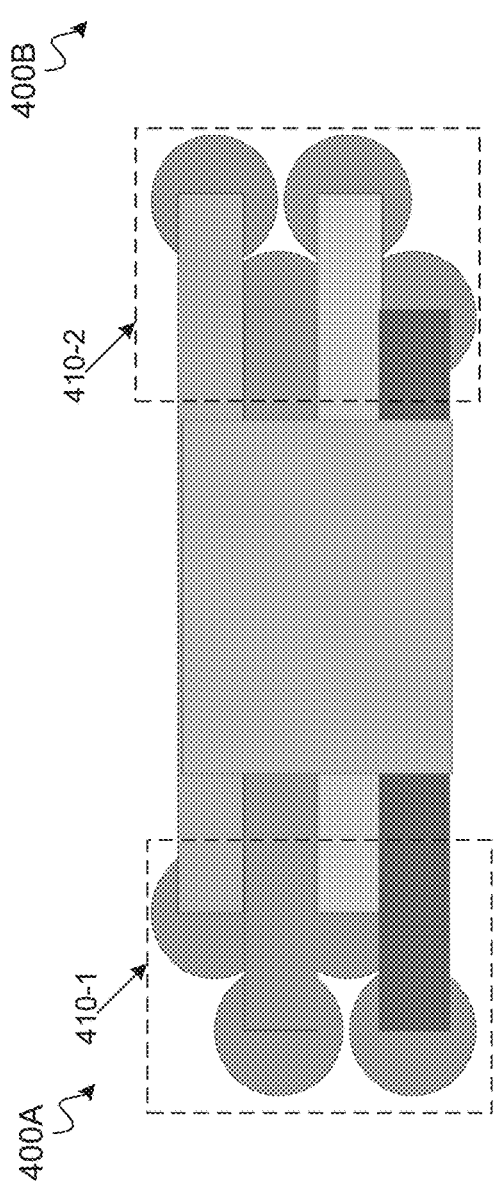
Figure 4C:
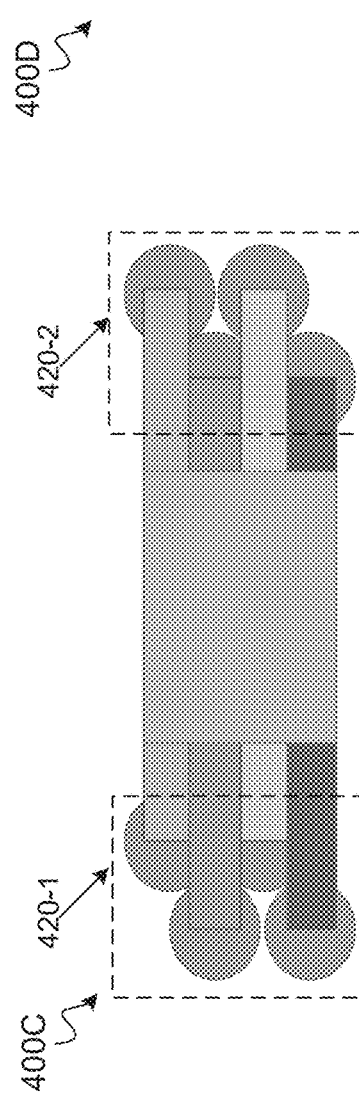

FIGS. 3A and 3B are schematic diagrams illustrating basic layouts 300A and 300B of lenslets and waveguides of an example blade of a PIC-based imager, according to certain aspects of the disclosure. The layout 300A shows four pairs of lenslets 302 (302-1 and 302-2), 304 (304-1 and 304-2), 306 (306-1 and 306-2) and 308 (308-1 and 308-2) with the same separation lengths. The four pairs of lenslets 302, 304, 306 and 308 are shown to have a relative offset. The relative offsets shown in the layout 300A are not actual physical offsets of the lenslets, but symbolic representations of offsets of the waveguides that are coupled to these pairs of lenslets, as explained herein.

The layout 300B shows a cross-sectional view of a waveguide array 310, for example, a 20×20 array of waveguides that is coupled to the four pairs of lenslets 302, 304, 306 and 308. There are four groups of waveguides 312, 314, 316 and 318, which are distinguished by different shades of gray or color. The four groups of waveguides 312, 314, 316 and 318 are scattered within the array in a regular configuration to have relative positional offset with respect to one another. Each group of the waveguides is optically coupled to a pair of lenslets. For example, waveguides of group 312 that are 100 waveguides are coupled to the lenslet pair 302, and waveguides of group 314 are coupled to the lenslet pair 304. Similarly, waveguides of group 316 and 318 are coupled to the lenslet pair 306 and 308, respectively.

In the coupling configuration discussed herein, each lenslet pair (e.g., 302) is coupled to a 10×10 subarray of waveguides (e.g., 312). The arrangements of waveguides in the waveguide array 310 is such that the waveguides coupled to each pair of lenslets in each row or column of the waveguide array 310 are not adjacent to one another, but are separated by waveguides of the other groups of waveguides. For example, in the odd row numbers (e.g., first, third, and so on) of the waveguide array 310, waveguides of the waveguide group 312 are separated by waveguides of the waveguide group 314, and in the even row numbers (e.g., second, fourth, and so on), waveguides of the waveguide group 316 are separated by waveguides of the waveguide group 318. The relative offset of the waveguides, as shown in the layout 300B, allows a full sampling of field-of-view (FOV) points of the target.

FIGS. 4A, 4B, 4C and 4D are conceptual diagrams illustrating basic layouts 400A, 400B, 400C and 400D of lenslets and waveguides of an example blade of a PIC-based imager, according to certain aspects of the disclosure. The layouts 400A and 400C show two sets of four lenslets 410 (410-1 and 410-2) and 420 (420-1 and 420-2). The lenslet pairs of the first set 410 have larger diameters and populate larger baselines than the lenslet pairs of the second set 420. Each lenslet pair of the first set 410 is coupled to a 10×10 subarray of a 20×20 waveguide array 410 of the layout 400B, whereas, each lenslet pair of the second set 420 is coupled to a 5×5 subarray of a 10×10 waveguide array 430 of the layout 400D. In other words, based on the waveguide arrangements of the layouts 400B and 400D, the larger baselines can advantageously result in a larger number of smaller samples. However, the shorter baselines are also needed to fill the sampled spatial frequency space of the target. In some implementations, the lengths of the baselines populated by the first set 410 and the second set 420 are about 50 cm and 25 cm, respectively.

Figure 5:
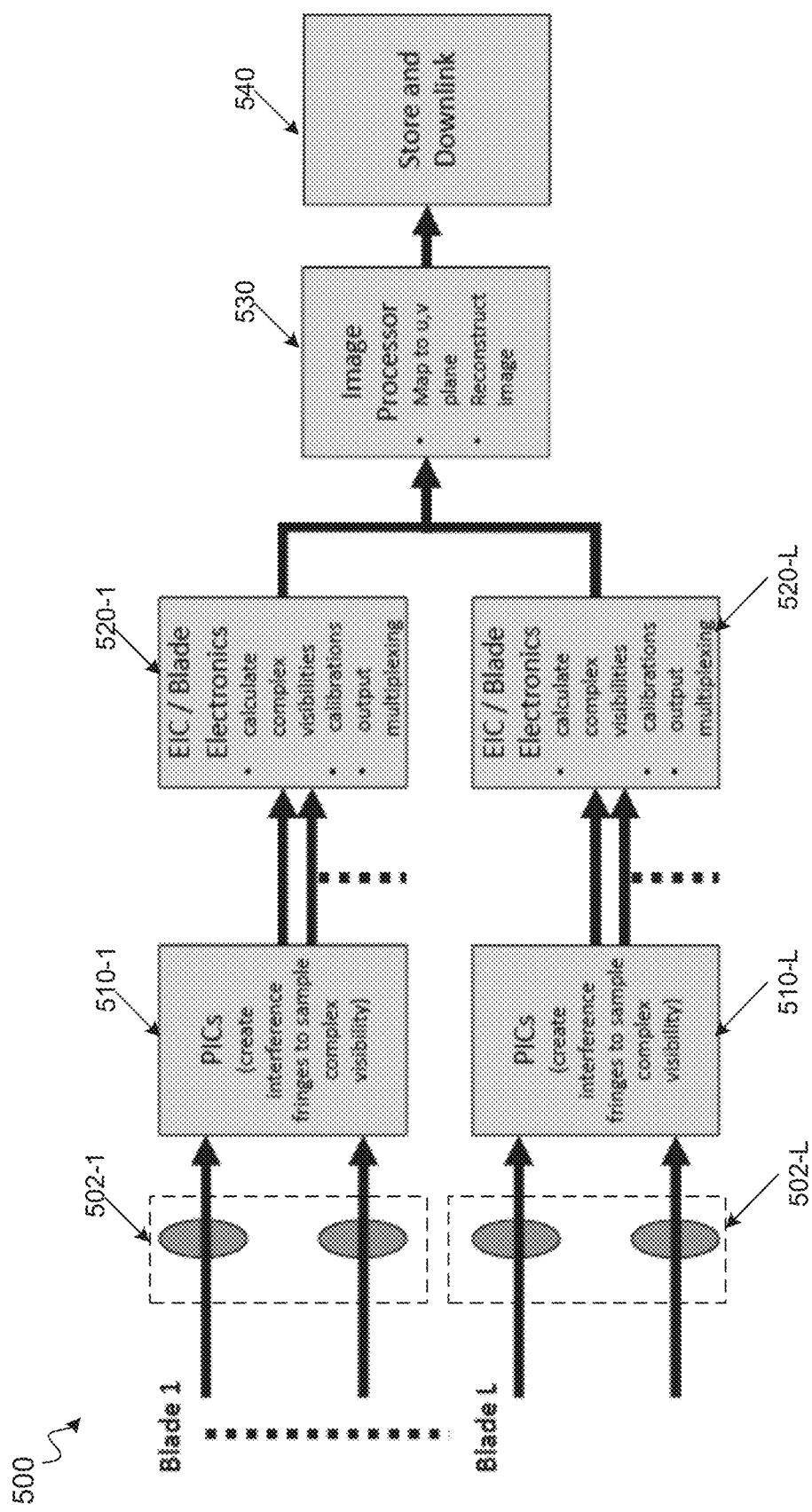
FIG. 5 is a block diagram illustrating an example of a megapixel-resolution PIC-based imager system, according to certain aspects of the disclosure.

FIG. 5 is a block diagram illustrating an example of a megapixel-resolution PIC-based imager system 500 (hereinafter, imager system 500), according to certain aspects of the disclosure. The imager system 500 includes blades 1 through L (e.g., 110 of FIG. 1A), sets of lenslets 502 (502-1 through 502-L), PICs 510 (510-1 through 510-L), EICs 520 (520-1 through 520-L), image processor 530 and store-and-downlink block 540. In one or more implementations, the blades 1 through L are similar to the blade 110 of FIG. 1A or 1B or 210 of FIG. 2A described above. The sets of lenslets 502 are similar to the set of lenslets 224 of FIG. 2A, and the PICs 510 are similar to the PICs 220 of FIGS. 2B and 2C. Each of the PICs 510 includes waveguides which are arranged as waveguide arrays (e.g., 310 of FIG. 3B or 430 of FIG. 4D), as discussed above. Each PIC 510 can, for example, generate an N×M array of interference fringe data that are transferred to an EIC of the EICs 520. Each EIC of the EICs 520 includes logic and circuitry to perform, for example, calculation of complex visibilities, calibrations, and output multiplexing of data for transferring to the image processor 530. The image processor 530 includes logic and circuitry to process the data transferred from the EICs 520, for example, to map the spatial data to a spatial-frequency space (U-V plane) and reconstruct an image of the target. The image reconstructed by the image processor 530 can be stored and/or downlinked (e.g., to a gateway) by the store-and-downlink block 540.

Figure 6:
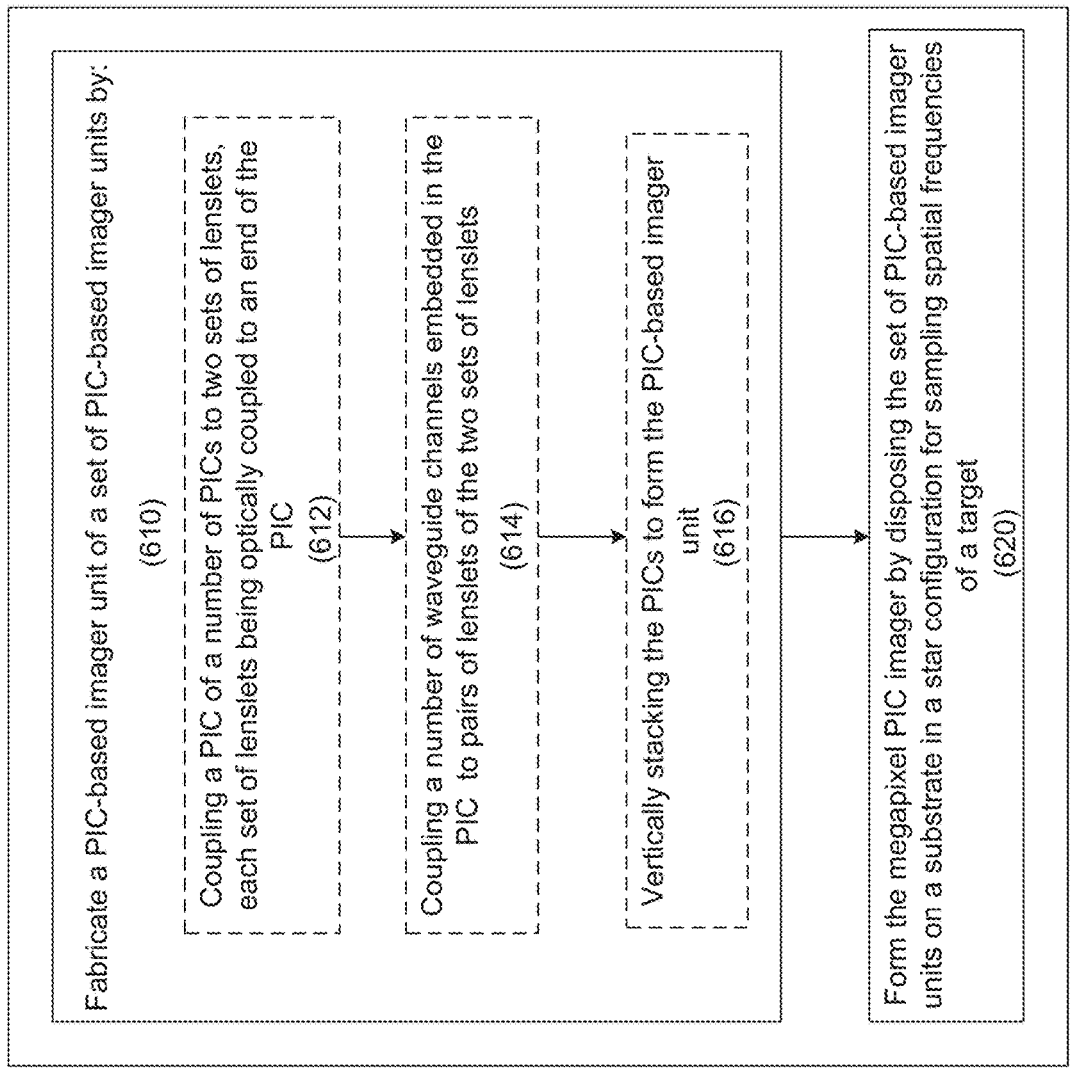
FIG. 6 is a flow diagram illustrating an example method of providing a megapixel PIC imager, according to certain aspects of the disclosure.

FIG. 6 is a flow diagram illustrating an example method 600 of providing a linear-fan-configured PIC imager, according to certain aspects of the disclosure. The method 600 includes fabricating a PIC-based imager unit (e.g., 110 of FIG. 1B) of a set of PIC-based imager units (e.g., 110 of FIG. 1A) (610) by coupling a PIC (e.g., 220 of FIG. 2B or 2C) to two sets of lenslets (e.g., 124 of FIG. 1B or 224 of FIG. 2C) (612). Each set of lenslets is optically coupled to an end of the PIC. A number of waveguide channels (e.g., 232 of FIG. 2C or 300B of FIG. 3B) embedded in the PIC are coupled to pairs of lenslets of the two sets of lenslets (614), and the PICs are vertically stacked to form the PIC-based imager unit (616). The megapixel PIC imager (e.g., 102 of FIG. 1) is then formed by disposing the set of PIC-based imager units on a substrate in a star configuration for sampling spatial frequencies of a target (620).

Figure 7:
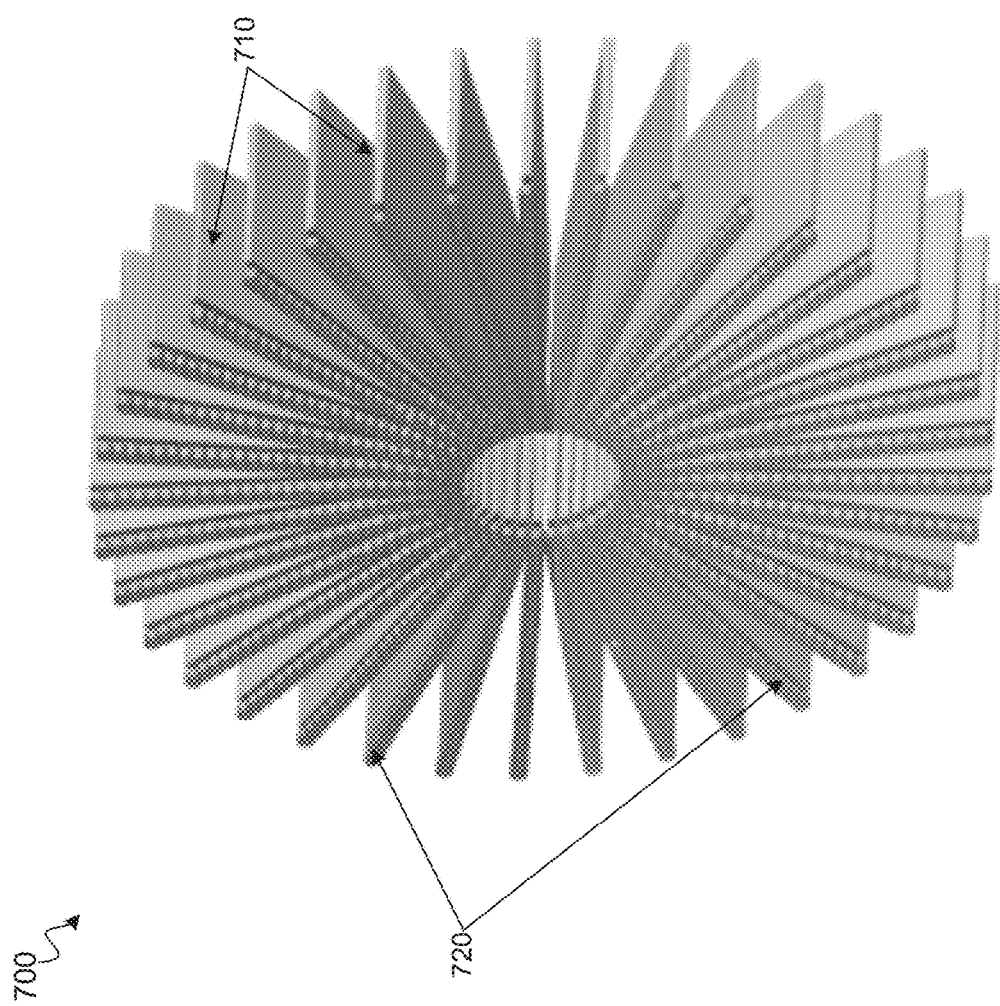
FIG. 7 is a conceptual diagram illustrating an example of a segmented planar imaging detector for electro-optical reconnaissance (SPIDER).

FIG. 7 is a conceptual diagram illustrating an example of a segmented planar imaging detector for electro-optical reconnaissance (SPIDER) 700. Each blade 710 includes a sensor array implemented on a PIC. Each sensor array is an interferometric imaging device including a number of waveguide arrays. Each blade 710 includes a lenslet array 720 consisting of a large number of lenslets arranged in a linear array and coupled to an edge of blade 710. Each lenslet concentrates light rays to a number of waveguides of a waveguide array. A more detailed discussion of SPIDER can be found in U.S. Pat. No. 8,913,859 B1, which is incorporated herein by reference.

In some aspects, the subject technology is related to photonic integrated circuits, and more particularly to megapixel-resolution PIC-based imagers. In some aspects, the subject technology may be used in various markets, including, for example and without limitation, sensor technology and communication system markets.

Those of skill in the art would appreciate that the various illustrative blocks, modules, elements, components, methods, and algorithms described herein may be implemented as electronic hardware, computer software, or a combination of both. To illustrate this interchangeability of hardware and software, various illustrative blocks, modules, elements, components, methods, and algorithms have been described above generally in terms of their functionalities. Whether such a functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks may be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single hardware and software product or packaged into multiple hardware and software products.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended on the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meanings unless otherwise explicitly and clearly defined by the patentee. If there is any conflict in the usage of a word or term in this specification and one or more patent or other documents that may be incorporated herein by reference, the definition that is consistent with this specification should be adopted.

What is claimed is:

1. A photonic integrated circuit (PIC)-based imager blade, comprising:
   a plurality of PIC imager units stacked on top of one another, a PIC imager unit of the plurality of PIC imager units comprising:
      a PIC coupled, at a first end and a second end, to a first set of lenslets and a second set of lenslets, respectively; and
      an electronic integrated circuit (EIC) coupled to the PIC,
      wherein pairs of lenslets of the first set of lenslets and the second set of lenslets are optically coupled to respective waveguides embedded in the PIC, and the PIC imager units of the plurality of PIC imager units have different lengths.

2. The PIC-based imager blade of claim 1, wherein the PIC imager unit further comprises a first and second prism configured to respectively couple the first set of lenslets and the second set of lenslets to the respective waveguides embedded in the PIC.

3. The PIC-based imager blade of claim 1, wherein optical axes of the first set of lenslets and the second set of lenslets are normal to a plane of the PIC.

4. The PIC-based imager blade of claim 1, wherein lenslets of first set of lenslets and the second set of lenslets corresponding to a longer PIC imager unit of the PIC imager units have larger diameters.

5. The PIC-based imager blade of claim 1, wherein pairs of lenslets of the first set of lenslets and the second set of lenslets corresponding to the PIC imager unit populate same baseline lengths and are coupled to the respective waveguides that are positioned with relative offsets to allow a full sampling of field-of-view (FOV) points of a target.

6. The PIC-based imager blade of claim 1, wherein a length of a longest PIC imager unit of the plurality of PIC imager units is within a range of about 40 cm to 60 cm.

7. The PIC-based imager blade of claim 1, wherein each lenslet of the first set of lenslets and a second set of lenslets couples input light beams from a target to an array of waveguides.

8. The PIC-based imager blade of claim 1, wherein the PIC comprises array waveguide gratings (AWGs) configured to generate interference fringes to sample complex visibilities.

9. An interferometric imager, comprising:
   a set of PIC-based imager blades configured to sample spatial frequencies of a target, each PIC-based imager blade comprising:
      a vertical stack of a plurality of PIC imager units with different lengths, a PIC imager unit of the plurality of PIC imager units comprising:
         a PIC including a plurality of waveguides embedded in the PIC and coupled on each end to a set of lenslets, and
         an EIC coupled to the PIC,
      wherein pairs of lenslets of the set of lenslets are optically coupled to respective waveguides of the plurality of waveguides embedded in the PIC, and blades of the set of PIC-based imager blades are disposed in different angular positions on a substrate.

10. The interferometric imager of claim 9, wherein optical axes of lenslets of the set of lenslets are normal to a plane of the PIC and are configured to direct input light beams from the target into respective waveguides of the plurality of waveguides.

11. The interferometric imager of claim 9, wherein lenslets of the set of lenslets are configured to direct input light beams from the target into respective waveguides of the plurality of waveguides.

12. The interferometric imager of claim 9, wherein lenslets of the set of lenslets corresponding to a longer PIC imager unit of the PIC imager units have larger diameters.

13. The interferometric imager of claim 12, wherein each lenslet of the set of lenslets couples input light beams from the target to an array of waveguides.

14. The interferometric imager of claim 9, wherein pairs of lenslets of the set of lenslets corresponding to the PIC imager unit populate same baseline lengths and are coupled to respective waveguides that are positioned with relative offsets to allow a full sampling of FOV points of the target.

15. The interferometric imager of claim 9, wherein the interferometric imager comprises a high-resolution interferometric imager with a megapixel resolution and a width within a range of about several centimeters to over a meter.

16. The interferometric imager of claim 9, wherein each of the pairs of the lenslets of the set of lenslets is coupled to waveguides of about 100 interferometer channels.

* * * * *